United States Patent [19]
Nishino et al.

[11] Patent Number: 5,326,745
[45] Date of Patent: * Jul. 5, 1994

[54] SUPERCONDUCTING DEVICE WITH C-AXIS ORIENTATION PERPENDICULAR TO CURRENT FLOW

[75] Inventors: Toshikazu Nishino, Kawasaki; Ushio Kawabe, Tokyo; Yoshinobu Tarutani, Yamanashi; Shinya Kominami, Tokorozawa; Toshiyuki Aida, Tokyo; Tokuumi Fukazawa, Tachikawa; Mutsuko Hatano, Kodaira, all of Japan

[73] Assignee: Hitachi, Ltd., Tokyo, Japan

[*] Notice: The portion of the term of this patent subsequent to Jun. 30, 2009 has been disclaimed.

[21] Appl. No.: 853,593

[22] Filed: Mar. 17, 1992

Related U.S. Application Data

[62] Division of Ser. No. 155,806, Feb. 16, 1988, Pat. No. 5,126,315.

[30] Foreign Application Priority Data

Feb. 27, 1987 [JP] Japan .................. 62-42558
Jun. 15, 1987 [JP] Japan .................. 62-147043
Jun. 29, 1987 [JP] Japan .................. 62-159596

[51] Int. Cl.$^5$ ............. H01B 12/00; H01L 39/22; H01L 23/48
[52] U.S. Cl. ................... 505/220; 257/662; 257/663; 257/33; 505/700; 505/703; 505/704; 505/191
[58] Field of Search ............... 357/5; 505/1, 701, 776, 505/777, 778, 704; 257/661–663, 33

[56] References Cited

PUBLICATIONS

Bednorz et al, "Possible High-$T_c$ Superconductivity in the Ba-La-Cu-O System", Z. Phys. B, Condensed Matter, vol. 64, 1986, pp. 189–193.
Dinger et al, "Direct Observation of Electronic Anistropy in Single-Crystal Y-Ba-Cu-O", Physical Rev. Lett., vol. 58, #25, Jun. 22, 1987, pp. 2687–2690.
Farrell et al, "Superconducting Properties of Aligned Crystalline Grains of Y-Ba-Cu-O," Physical Review B, vol. 36, #7, Sep. 1, 1987, pp. 4025–4027.

Primary Examiner—Rolf Hille
Assistant Examiner—Mahshid Saadat
Attorney, Agent, or Firm—Antonelli, Terry, Stout & Kraus

[57] ABSTRACT

Superconducting device include a type having a structure of a superconductor—a normal-conductor (or a semiconductor)—a superconductor, and a type having a superconducting weak-link portion between superconductors.

The superconductors constituting the superconducting device are made of an oxide of either of perovskite type and $K_2NiF_4$ type crystalline structures, containing at least one element selected from the group consisting of Ba, Sr, Ca, Mg, and Ra; at least one element selected from the group consisting of La, Y, Ce, Sc, Sm, Eu, Er, Gd, Ho, Yb, Nd, Pr, Lu, and Tb; Cu; and O. In addition, the c-axis of the crystal of the superconductor is substantially perpendicular to the direction of current flowing through this superconductor.

3 Claims, 5 Drawing Sheets

SUPERCONDUCTING DEVICE WITH C-AXIS ORIENTATION PERPENDICULAR TO CURRENT FLOW

This application is a divisional application of application Ser. No. 07/155,806, filed Feb. 16, 1988, now U.S. Pat. No. 5,126,315.

BACKGROUND OF THE INVENTION

1. Field of the Invention

The present invention relates to a superconducting device which operates at the liquid nitrogen temperature or above, and more particularly to a superconducting device which is readily produced and which operates stably.

2. Description of the Related Art

Heretofore, materials such as $Nb_3Ge$ have been used as the materials of superconducting devices which operate at high temperatures. This technique is discussed by H. Rogalla et al. in "IEEE Transactions," MAG-15, 536 (1985).

A prior-art superconducting device in which a plurality of electrodes exhibitive of a superconductivity are coupled through a semiconductor or a normal-conductor, is discussed by R. B. van Dover et al. in "Journal of Applied Physics," vol. 52, p. 7327, 1981. Besides, a three-terminal superconducting device in which the above superconducting device is additionally provided with means for changing the coupling between the superconducting electrodes on the basis of the field effect is discussed by T. D. Clark et al. in "Journal of Applied Physics," vol. 5, p. 2736, 1980. The sectional structure of the three-terminal superconducting device is shown in FIG. 1. In this device, the value of a superconducting current to flow via a semiconductor layer 2 across two superconducting electrodes 3a and 3b disposed in contact with the semiconductor layer 2 on a substrate 1 is controlled in such a way that the superconducting proximity effect is changed by a voltage applied to a control electrode 5 disposed between both the electrodes 3a and 3b. The control electrode 5 is disposed on the semiconductor layer 2 through an electric insulator film 4.

The prior art has used Pb, Pb alloys, Nb and Nb compounds as the materials of the superconducting electrodes. In order to operate the superconducting device employing any of these materials, accordingly, the device must be installed in the atmosphere of a cryogenic temperature near the liquid helium temperature (4.2 K.). Further, the two superconducting electrodes must be provided at a spacing within 0.5 μm in order to intensify the influence of the superconducting proximity effect between these superconducting electrodes, and this has made the fabrication of the device very difficult.

Moreover, in the prior art, the superconducting electrodes and the semiconductor or normal-conductor have been made of different materials of elements. By way of example, the material of the superconducting electrodes has been any of Nb, Pb alloys, Sn etc., while the material of the semiconductor or normal-conductor has been any of Si, InAs, Cu, etc. The combination of these materials, however, signifies that the device is constructed by stacking the materials of the superconductors and the semiconductor or normal-conductor, the electrical properties of which are quite different. That is, the superconducting device has a structure in which the surface of the semiconductor or normal-conductor is overlaid with the superconductors made of the different material. On this occasion, the characteristics of the superconductors are highly susceptible to the state of the surface of the semiconductor or normal-conductor, so that the characteristics of the device of such a structure are liable to change. It has therefore been difficult to reproducibly fabricate the superconducting device of this type.

The superconducting critical temperature ($T_c$) of the superconductors is at most 10-20K or so. This signifies that the characteristics of the device are prone to become unstable due to the temperature change thereof.

Since the prior-art superconducting device operates chiefly at the liquid helium temperature, it has been cooled down to that temperature by a method of immersion in liquid helium or cooling with helium gas. The liquid helium, however, is very expensive and is uneconomical as a coolant. Another problem has been that, since the liquid helium is at the temperature much lower than the room temperature, the handling thereof is, in itself, difficult. These problems of the liquid helium have directly led to problems on the economy and handling of the superconducting device itself.

In addition, the superconducting materials having heretofore been used are polycrystalline or amorphous. With the polycrystalline material, it is difficult to precisely microfabricate a part of or less than 0.5 μm. Besides, in case of using a material whose property as a superconductor depends upon the orientation of a crystal, the degree of the crystal orientation of the crystal grain of the polycrystalline material needs to be strictly controlled each time the superconductor is fabricated. In general, however, this control is difficult and has therefore incurred the problem that variation in characteristics at the stage of manufacture becomes large.

Typical as the structure of a prior-art superconducting device having a superconducting weak-link element is the so-called "micro-bridge" in which a superconducting film is partially fined to form a constriction, the constricted portion being endowed with a weak link property. Especially for the Nb-type superconducting material, optical patterning technology or electron-beam lithography and technology for processing the superconducting film have been combined to fabricate the superconducting weak-link element. Such a weak-link element is utilized as a magnetic quantum flux detector capable of detecting a feeble magnetic field or as a microwave/millimeter-wave detector of high sensitivity. The magnetic quantum flux detector has as high a flux resolving power as $10^{-9}$ Oe., and is applied to a magnetoencephalogram detector and a magnetocardiogram detector. The microwave detection range of the weak-link element can cover a high frequency band up to $10^{12}$ Hz which cannot be attained with another semiconductor element. In this manner, the superconducting device furnished with the superconducting weak-link element exhibits the excellent performance as the detector for the electromagnetic waves. Since, however, the Nb-type superconducting material in the prior art has a critical temperature of 23 K. or below, also the superconducting device formed using the Nb-type superconducting material has inevitably been operated in the liquid helium (4.2 K.).

Such a known example is stated in "IEEE Transactions on Magnetics," vol. MAG-21, No. 2, MARCH 1985, pp. 932-934.

SUMMARY OF THE INVENTION

The first object of the present invention is to provide a superconducting device which operates stably against temperature changes and which is operable at a temperature of or above the liquid nitrogen temperature.

The second object of the present invention is to provide a superconducting device which is superior in economy and which is easy of handling.

The third object of the present invention is to provide a superconducting device which can be easily manufactured and which affords articles of uniform characteristics.

The fourth object of the present invention is to provide a superconducting device which affords an efficient flow of superconducting electrons.

The fifth object of the present invention is to provide a superconducting device the device sensitivity and gain of which are high.

The first, second, third and fourth objects mentioned above are accomplished in such a way that the c-axis of the crystal of an oxide superconductor constituting the superconducting device is oriented so as to become substantially perpendicular to the direction of superconducting current which flows within the oxide superconductor.

For example, in a superconducting material having a layered perovskite crystalline structure with oxygen vacancy or a $K_2NiF_4$-type crystalline structure, the superconducting property depends upon the crystallographic orientation in such a manner that a superconductivity within a plane perpendicular to the c-axis, namely, within the c-plane is intense and that carriers behave intensely in two dimensions within the plane. Therefore, the direction in which a great current sufficient for use as the device can be caused to flow lies within the c-plane, and this plane has the flow of superconducting electrons about 10 times as many as those in any other plane. Thus, the superconducting current can be caused to flow efficiently by the measure that the c-axis of the crystal of the superconductor is oriented substantially orthogonal to the direction of the current flowing within the superconductor.

According to the present invention, in a superconducting device in which a superconductor and a normal-conductor or semiconductor are used in combination, crystal lattices at the interface between the superconductor and the normal-conductor or semiconductor are formed into a matched state, and besides, the direction in which current flows within the device agrees with the direction in which the superconductivity of the material is high, so that a sufficiently great superconducting current can be caused to flow. The invention therefore has the effect that a superconducting device which has stable characteristics and can be produced at favorable reproducibility and which affords a stable circuit operation can be realized.

The first, second, third and fifth objects mentioned above are accomplished by connecting a superconductor and a normal-conductor (or semiconductor) so that the c-plane of the crystal of the superconductor may become perpendicular to the contact plane of the superconductor and the normal-conductor (or semiconductor). According to this construction, the probability at which electron pairs or electrons leak from the superconductor into the semiconductor or normal-conductor becomes high. That is, the interface between the superconductor and the semiconductor or normal-conductor matches well with electron waves, and an efficient flow of electrons arises. Accordingly, it becomes possible to realize a superconducting device of stable operation and high gain. A similar effect can be attained also in case of employing a polycrystalline material in which crystal grains are oriented.

Further, in a superconducting material having a $K_2NiF_4$-type crystalline structure whose composition is indicated by $(La_{1-x}A_x)_2CuO_4$ (where the letter A denotes a substance such as $Sr_{1-y-z}Ba_yCa_z$), the superconducting property depends upon the crystallographic orientation (oriented polycrystalline film) in such a manner that a superconductor exhibits an intense anisotropic electrically-conducting characteristic within the c-plane, namely, the plane perpendicular to the c-axis. Therefore, the direction in which a great current sufficient as a device is caused to flow needs to lie within the plane perpendicular to the c-axis of the crystal. For this reason, a plane where the superconductor and a normal-conductor lie in contact with a substrate to form the superconducting device thereon, in other words, the front surface of the substrate, should desirably be perpendicular to the c-axis of the single-crystal material of which the superconductor or the normal-conductor is made. In this case, the direction of the current flow and the direction of the highest superconductivity agree in the superconducting device, so that the operation of the device can be stabilized.

The above has referred to the case of using monocrystalline materials for the superconducting electrodes and the semiconductor, but a similar effect can be attained also in case of employing polycrystalline materials in which crystal grains are oriented. Also in this case, it is desired for the orientation of the crystal grains that the c-axes of the crystal grains become perpendicular to the front surface of the substrate. On the oriented normal-conductor or semiconductor, the superconducting electrodes having the same orientation are readily formed. In such a case, the same effect as in the above-stated case of employing the monocrystalline materials can be attained.

Besides, it has been explained above that the normal-conductor or semiconductor is first formed and that the superconductor is subsequently formed. However, even when this order is altered, a quite similar effect can be brought forth.

These and other objects and many of the attendant advantages of this invention will be readily appreciated as the same becomes better understood by reference to the following detailed description when considered in connection with the accompanying drawings.

DETAILED DESCRIPTION OF THE PREFERRED EMBODIMENTS

Now, the present invention will be described in detail in conjunction with embodiments.

Embodiment 1

Figure 2:
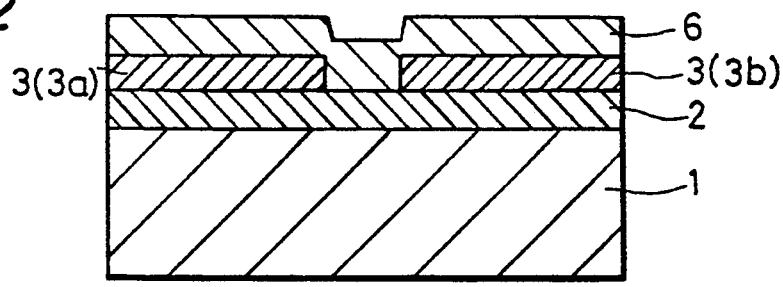
FIG. 2 is a sectional view showing a part of a superconducting device according to the first embodiment of the present invention.

The first embodiment of the present invention will be described with reference to FIG. 2. A substrate 1 is made of an $SrTiO_3$ single crystal, the principal surface of which is perpendicular to the c-axis thereof. On the principal surface of the substrate 1, a normal-conductor or semiconductor 2 which has a composition of $(La_{0.9}Ca_{0.1})_2CuO_4$ and which is about 100 nm thick is formed by sputtering. Since the normal-conductor or semiconductor 2 is formed on the flat substrate 1; the film thickness thereof is fixed. The normal-conductor or semiconductor 2 is heat-treated at about 1000° C. for about 10 seconds by inductive heating. Then, it becomes a single-crystal thin film the c-axis of which lies in the same direction as the c-axis of the substrate 1. Subsequently, a superconductor 3 having a composition of $(La_{0.9}Sr_{0.1})_2CuO_4$ and being about 100 nm thick is similarly formed by sputtering. Since the superconductor 3 has a crystal orientation dependent upon the orientation of the subbing normal-conductor or semiconductor 2, it is also oriented in the c-axial direction likewise to the substrate 1 and the normal-conductor or semiconductor 2. A pattern of photoresist is formed on the surface of the superconductor 3, whereupon using it as a mask, sputter-etching with Ar ions is carried out to process the superconductor 3 into two opposing superconducting electrodes 3a and 3b. The length between the two superconducting electrodes 3a and 3b is about 3-10 times the coherence length of the normal-conductor or semiconductor 2. Subsequently, a protective film 6 made of $SiO_2$ and having a thickness of about 150 nm is formed by chemical vapor deposition (CVD). This protective film 6 is formed in order to prevent the drawback that, in a case where an oxide containing a rare-earth element is used as the material of the superconductor 3, the superconducting characteristics of the material are changed by the diffusion of hydrogen or oxygen and the composition change of the surface of the material, so the characteristics of the device deteriorate with time. In this manner, when the oxide-type material is applied to the superconductor as in the present embodiment, the use of the protective film 6 is desirable. Apart from $SiO_2$, the material of the protective film 6 may well be an electric insulator such as SiO or $Si_3N_4$, an organic high polymer, or the like. In the above way, the superconducting device having the structure of the superconductor 3a—normal-conductor (semiconductor) 2—superconductor 3b can be obtained. In this case, the interface between the normal-conductor 2 and the superconductor 3 was free from contamination, etc. because both the layers were formed to be continuous, and it could be formed under an ideal state with little reflection of carriers because crystal lattices matched favorably. These brought forth the effects that the uniformity and reproducibility of characteristics were excellent and that circuit operations became stable. In the present embodiment, $SrTiO_3$ or sapphire was employed as the material of the substrate 1. Alternatively, a ceramics material such as SiC or a garnet material such as GGG may well be employed.

Embodiment 2

Next, the second embodiment of the present invention will be described with reference to FIG. 3. In the first embodiment, the normal-conductor or semiconductor 2 was previously formed. As already described, however, the superconductor 3 can be previously formed. Conditions for the formation may be similar to those of the first embodiment. More specifically, on a substrate 1 ($SrTiO_3$ single crystal) the principal surface of which is perpendicular to the c-axis of the crystal, a superconductor 3 having a composition of $(La_{0.9}Sr_{0.1})_2CuO_4$ and being about 100 nm thick is formed by sputtering. A pattern of photoresist is formed on the surface of the superconductor 3, whereupon using it as a mask, the superconductor 3 is etched and processed to form two opposing superconducting electrodes 3a and 3b. Subsequently, a normal-conductor or semiconductor 2 having a composition of $(La_{0.9}Ca_{0.1})_2CuO_4$ and being about 200 nm thick is deposited and formed by sputtering. This normal-conductor or semiconductor is heat-treated at about 1000° C. for about 10 seconds by inductive heating. Then, the normal-conductor or semiconductor 2 and the superconductors 3 become polycrystalline or single-crystal thin films the c-axes of which lie in the same direction as the c-axis of the substrate 1 (in other words, in a direction perpendicular to the principal surface of the substrate 1) as in Embodiment 1. In this way, the device of the present invention having the structure of the superconductor 3a—normal-conductor (semiconductor) 2—superconductor 3b can be obtained.

Embodiment 3

Figure 4:
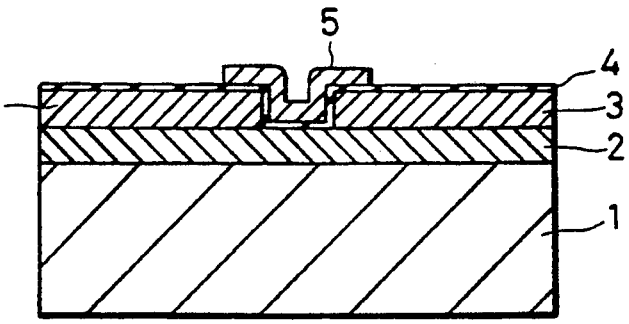
FIG. 4 is a sectional view showing a part of a superconducting device according to the third embodiment of the present invention.

Next, the third embodiment of the present invention will be described with reference to FIG. 4. On the surface of the superconducting device according to the first embodiment illustrated in FIG. 2, an electric insulator film 4 made of $SiO_2$ and being about 20-120 nm thick is formed by CVD (chemical vapor deposition) without forming the protective film 6. Subsequently, a control electrode 5 made of Nb and being about 300 nm thick is formed by deposition based on sputtering and processing based on reactive ion etching with $CF_4$ gas. Thus, a three-terminal superconducting device can be realized. The control electrode 5 can control current which flows across the two superconducting electrodes 3a and 3b. Although this device includes the control electrode 5, it can of course offer the superconducting device which is excellent in the uniformity and reproducibility of characteristics, likewise to the two preceding embodiments.

Embodiment 4

Figure 5:
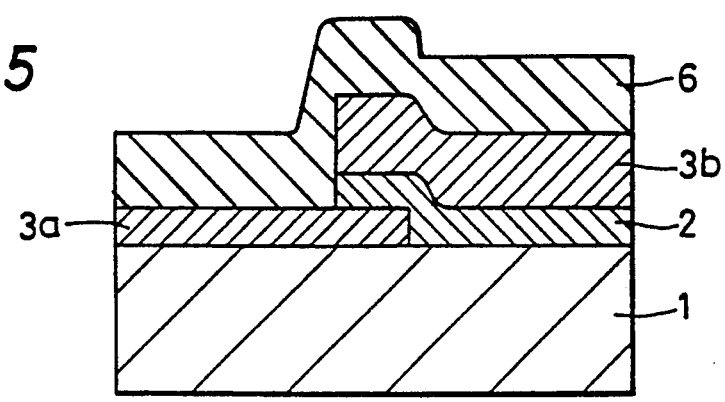
FIG. 5 is a sectional view showing a part of a superconducting device according to the fourth embodiment of the present invention.

Now, the fourth embodiment of the present invention will be described with reference to FIG. 5. On a substrate 1 (SrTiO$_3$ single crystal or sapphire) the principal surface of which is perpendicular to the c-axis of the crystal, a superconductor 3a having a composition of (La$_{0.9}$Sr$_{0.1}$)$_2$CuO$_4$ and being about 100 nm thick is formed by sputtering. This superconductor 3a is heat-treated in an oxygen atmosphere at about 920° C. for 2 hours. Thus, it can be turned into a polycrystalline thin film or single-crystal thin film the c-axis of which lies in the same direction as that of the substrate 1. Subsequently, a normal-conductor or semiconductor 2 having a composition of (La$_{0.9}$Ca$_{0.1}$)$_2$CuO$_4$ and being about 100 nm thick, and a second superconductor 3b having a composition of (La$_{0.9}$Sr$_{0.1}$)$_2$CuO$_4$ and being about 200 nm thick are formed by ion-beam sputtering.

The superconductor 3a is processed by chemical etching in which a pattern of photoresist is used as a pattern. The normal-conductor or semiconductor 2 and the second superconductor 3b are formed through a metal mask. In addition, the superconductor 3b is heat-treated in an oxygen atmosphere at about 920° C. for 2 hours. Thus, likewise to the superconductor 3a, this superconductor 3b turns into a polycrystalline thin film the c-axis of which lies in the same direction as that of the substrate 1. At the next step, a protective film 6 made of SiO$_2$ and having a thickness of about 150 nm is formed by chemical vapor deposition (CVD). In the above way, the superconducting device having the structure of the superconductor 3a—normal-conductor (semiconductor) 2—superconductor 3b can be obtained. The present embodiment has the sandwich structure in which the superconductor 3a and the second superconductor 3b hold the normal-conductor or semiconductor 2 therebetween. It differs from the first embodiment of the present invention in this point. Even with such a sandwich structure, the objects of the present invention can be satisfactorily achieved. In the case where the semiconductor is sandwiched as the member 2, a Schottky barrier intervenes between each superconductor and the semiconductor, and the tunnel effect becomes important in the mechanism of electric conduction. Needless to say, however, the present invention is sufficiently effective even for such a tunnel junction.

Embodiment 5

The material of the superconducting electrodes employed in the superconducting devices disclosed as the embodiments of FIGS. 2 thru 5 is the superconducting oxide material of the perovskite type having a high superconducting critical temperature. In this material, in view of the crystalline structure, superconducting electron pairs are easy of flowing in the direction of the a-b plane (in a direction perpendicular to the c-axis) and are difficult of flowing in the same direction as the c-axis. Accordingly, the superconducting current of the superconducting device employing such a material for the superconducting electrodes flows in the direction of the superconducting electrode 3a→normal-conductor (semiconductor) 2→superconducting electrode 3b.

Therefore, the flows of electrons at the interfaces between the superconducting electrodes 3a, 3b and the normal-conductor (semiconductor) 2 become important. That is, the flow of current from the superconducting electrode 3a to the normal-conductor (semiconductor) 2 and the flow of current from the normal-conductor (semiconductor) 2 to the superconducting electrode 3b must be respectively enlarged.

Figure 3:
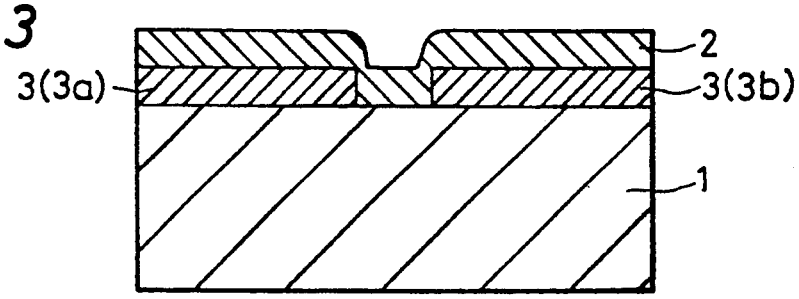
FIG. 3 is a sectional view showing a part of a superconducting device according to the second embodiment of the present invention.

In the case of FIG. 3, the currents of the superconducting electrodes 3a and 3b flow in parallel with the principal surface of the substrate 1 (vertically to the c-axis). Accordingly, the maximum superconducting current flows across the superconducting electrodes 3a and 3b via the normal-conductor (semiconductor) 2. In contrast, in the case where the layer of the superconducting electrodes 3a, 3b and that of the normal-conductor (semiconductor) 2 are different as in FIGS. 2 or 4, the flow of the current from the superconducting electrode 3a to the normal-conductor (semiconductor) 2 and that of the current from the normal-conductor (semiconductor) 2 to the superconducting electrode 3b intersect orthogonally to the flows of the currents of the superconducting electrodes 3a, 3b. Accordingly, such a superconducting device has had the problem that a sufficient superconducting current cannot be caused to flow across the superconductors 3a and 3b via the normal-conductor (semiconductor) 2 in the structure of the superconducting electrode 3a—normal-conductor (semiconductor) 2—superconducting electrode 3b.

An embodiment which has solved this problem will now be described.

Figure 6:
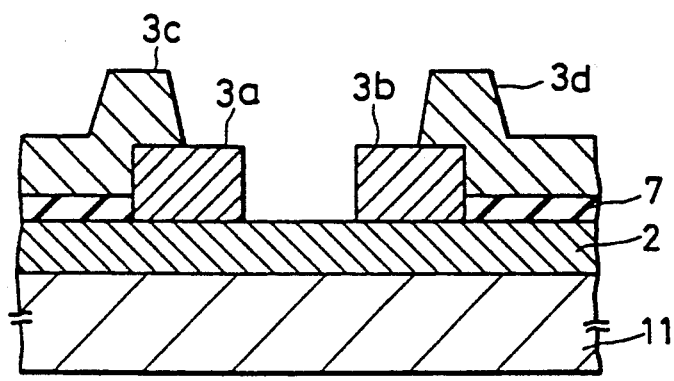
FIG. 6 is a sectional view showing a superconducting device which is the fifth embodiment of the present invention.

FIG. 6 is a sectional view of a superconducting device which is the fifth embodiment of the present invention. Unlike those of the first thru fourth embodiments, a substrate indicated at numeral 11 is made of SrTiO$_3$ and has its principal surface oriented to be parallel to the c-axis of the crystal. On this substrate 11, a normal-conductor (semiconductor) 2 having a composition of (La$_{0.9}$Ca$_{0.1}$)$_2$CuO$_4$ and being 200 nm thick is formed by sputtering. Thereafter, this normal-conductor (semiconductor) 2 is heat-treated at 100° C. for 10 seconds by inductive heating. Then, it becomes a single-crystal thin film the c-axis of which is parallel to that of the substrate 11. Subsequently, a superconducting thin film having a composition of (La$_{0.9}$Sr$_{0.1}$)$_2$CuO$_4$ and being about 300 nm thick is formed by sputtering. Since this superconducting thin film has a crystal orientation dependent upon the orientation of the crystal of the subbing normal-conductor (semiconductor) 2, it is so oriented that the c-axis thereof is parallel to the surface of the normal-conductor (semiconductor) 2, in other words, that the o-plane thereof is perpendicular to the same surface. Subsequently, the superconducting film is heated in an oxygen atmosphere of 950° C. for 1 hour. Thereafter, a pattern of photoresist is formed on the surface of the superconducting thin film. Using the pattern as a mask, sputter-etching with Ar ions is carried out to form two opposing superconducting electrodes 3a and 3b.

At the next step, an electric insulator film 7 made of SiO$_2$ and having a thickness of about 120 nm is formed by chemical vapor deposition (CVD). Subsequently, superconducting wiring leads 3c and 3d having the composition of (La$_{0.9}$Sr$_{0.1}$)$_2$CuO$_4$ and being about 100 nm thick are formed by ion-beam sputtering. Further, the superconducting wiring leads 3c and 3d are heated in an oxygen atmosphere of about 950° C. for 1 hour. Since the subbing material of the superconducting wiring leads 3c and 3d is the amorphous SiO$_2$ forming the insulator film 7, the c-axis of the crystal grain of the material forming these superconducting wiring leads is prone to be directed perpendicularly to the principal surface of the substrate 11. That is, the c-axes of the superconducting wiring leads 3c and 3d are prone to be oriented perpendicularly to the principal surface of the substrate 11. Although the orientation of the crystal grains is not perfect, a greater superconducting current can be caused to flow stably by making the orientation of the superconducting electrodes 3a, 3b and that of the superconducting wiring leads 3c, 3d different in this manner.

In this way, the superconducting device having the structure of the superconductor 3a—semiconductor 2—superconductor 3b can be obtained. With this device, the currents of the interfaces between the superconductors 3a, 3b and the semiconductor 2 flow favorably, and the direction of the flows agrees with the direction of a high superconductivity, so that the critical superconducting current to flow across the superconducting electrodes 3a and 3b increases to afford a stable operation.

Embodiment 6

Figure 7:
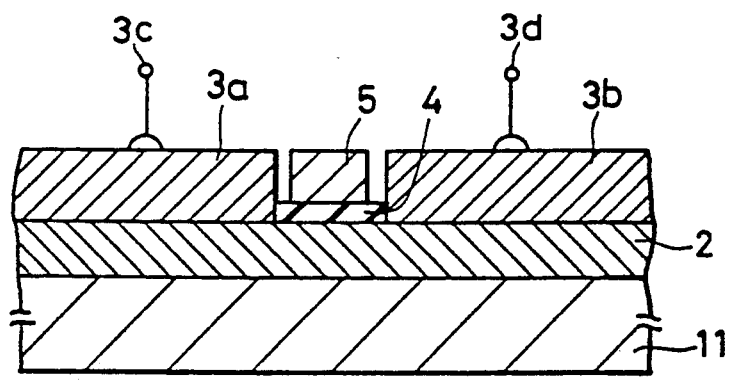
FIG. 7 is a sectional view showing a superconducting device which is the sixth embodiment.

Now, a superconducting device which is the sixth embodiment of the present invention will be described with reference to FIG. 7.

A control electrode 5 for controlling a superconducting current is added to the superconducting device which is the embodiment in FIG. 6. In FIG. 7, for the brevity of illustration, the superconducting wiring leads 3c and 3d in FIG. 6 are symbolically indicated, and the insulator film 7 is omitted from the illustration.

On the surface of the device disclosed as the fifth embodiment, an electric insulator film 4 made of SiO$_2$ and having a thickness of 100 nm is deposited by chemical vapor deposition (CVD). Thereafter, an Nb film having a thickness of about 300 nm is deposited by dc magnetron sputtering and is etched with CF$_4$ gas by employing a mask of photoresist so as to form the control electrode 5. In this way, a three-terminal superconducting device can be obtained. This device can enhance the superconducting proximity effect likewise to the fifth embodiment, and can therefore increase the magnitude of variation of the critical superconducting current relative to a fixed voltage applied to the control electrode. Accordingly, the gain of the device enlarges, and a stable operation is exhibited.

Embodiment 7

Figure 1:
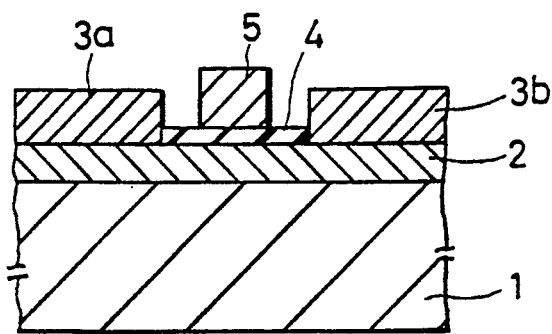
FIG. 1 is a sectional view for explaining a superconducting device in a prior art.
Figure 8:
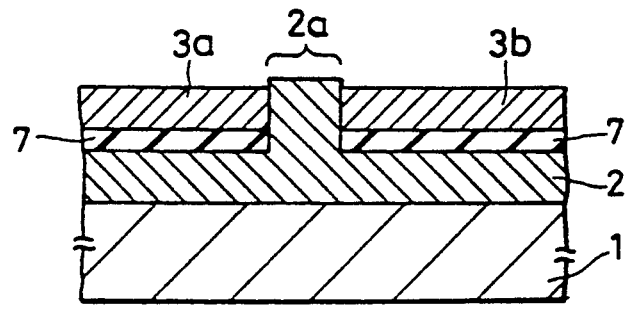
FIG. 8 is a sectional view showing a part of a superconducting device which is the seventh embodiment.

FIG. 8 is a sectional view of a superconducting device which is the seventh embodiment of the present invention. As in FIG. 1, a substrate 1 is made of an SrTiO$_3$ single crystal the principal surface of which is perpendicular to the c-axis. On this substrate 1, a normal-conductor (semiconductor) 2 made of (La$_{0.9}$Ca$_{0.1}$)$_2$CuO$_4$ and having a thickness of 500 nm is deposited by sputtering. Thereafter, the normal-conductor (semiconductor) 2 is heated at 1000° C. for 10 seconds by inductive heating. The c-axis of the normal-conductor (semiconductor) 2 lies in the same direction as the c-axis of the substrate 1, that is, it is perpendicular to the principal surface of the substrate 1. Using a mask of photoresist, the normal-conductor (semiconductor) 2 is etched down to a depth of 300 nm by plasma etching with CF$_4$ gas, whereby a projection 2a having a width of at most 0.5 μm is provided. Subsequently, an inter-layer insulator film 7 made of SiO$_2$ and having a thickness of 100 nm is formed by CVD. Thereafter, superconducting thin films 3a and 3b having a composition of (La$_{0.9}$Sr$_{0.1}$)$_2$CuO$_4$ and being 200 nm thick are formed by sputtering. Here, the superconducting thin films are so oriented that the c-planes thereof become perpendicular to the the side faces of the projection 2a made of the normal-conductor (semiconductor) 2. At the subsequent step, the photoresist is removed with a solvent. Then, the superconducting device shown in FIG. 8 is obtained. Since this device can enhance the superconducting proximity effect likewise to the embodiment in FIG. 2, the critical superconducting current increases, and a stable operation is exhibited.

Embodiment 8

Figure 9:
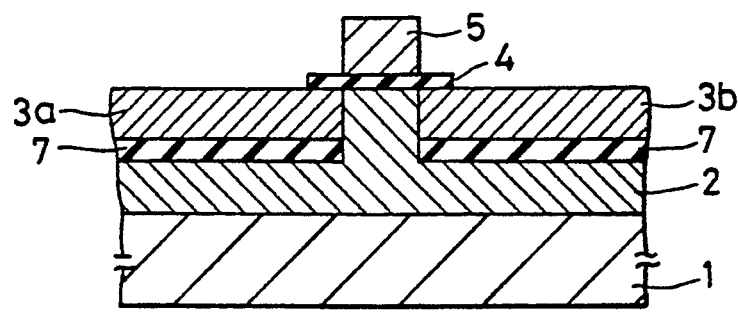
FIG. 9 is a sectional view showing a superconducting device which is the eighth embodiment.

FIG. 9 is a sectional view of a superconducting device which is the eighth embodiment of the present invention. This superconducting device is such that the device of the embodiment in FIG. 8 is additionally provided with a control electrode 5 for controlling a superconducting current. On the surface of the device disclosed as the embodiment in FIG. 8, an electric insulator film 4 made of SiO$_2$ and having a thickness of 100 nm is formed by CVD. Thereafter, an Nb film having a thickness of 300 nm is formed by dc magnetron sputtering. It is processed by reactive ion etching with CF$_4$ gas, thereby to form the control electrode 5. In this way, the superconducting device shown in FIG. 9 can be obtained. According to this device, the magnitude of variation of the critical superconducting current relative to a fixed voltage applied to the control electrode can be increased. The gain of the device enlarges, and a stable operation is exhibited.

Embodiment 9

Figure 10:
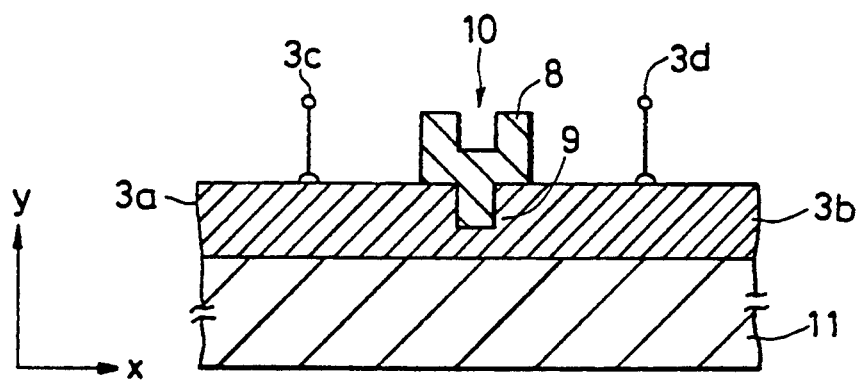
FIG. 10 is a sectional view showing a part of a superconducting device according to the ninth embodiment of the present invention.

Next, the ninth embodiment of the present invention will be described with reference to FIG. 10. On a substrate 11 made of the single crystal of SrTiO$_3$, a superconductor 3 having a composition of (La$_{0.9}$Sr$_{0.1}$)$_2$CuO$_4$ and being about 1 μm is deposited by sputtering so that the c-axis of the crystal may become perpendicular to the substrate. To this end, the crystal orientation of the principal surface of the substrate 11 may be selected to the c-plane beforehand. Subsequently, the superconductor 3 is heated in an oxygen atmosphere of 900° C. for 2 hours. Thereafter, a part of the superconductor is processed by Ar-ion etching so as to form a superconducting weak-link portion 9 which is about 0.2 μm thick and about 0.1 μm wide. At the subsequent step, a photoconductive semiconductor 8 made of CdS is formed on the weak-link portion. Then, the superconducting device of the present invention is fabricated. In the above way, it is possible to realize the superconducting device constructed of two superconducitgn electrodes 3a and 3b which are separated by the weak-link portion 9 and the c-planes of which are in perpendicular contact with the photoconductive semiconductor 8. In the device having such a structure, the direction in which the maximum superconducting current across the superconducting electrodes 3a and 3b flows and the direction of the flows of currents along the superconducting electrode 3a—photoconductive semiconductor 8—superconducting electrode 3b are in agreement and are the direction of an x-axis shown in the figure. Therefore, when light 10 is projected on the phtoconductive semiconductor 8, a great current can be caused to flow. Accordingly, the value of the current to flow in the x-axial direction can be readily controlled with the projection light of very low intensity, and the device operates as a photodetective device of high sensitivity and high speed.

Embodiment 10

Figure 11:
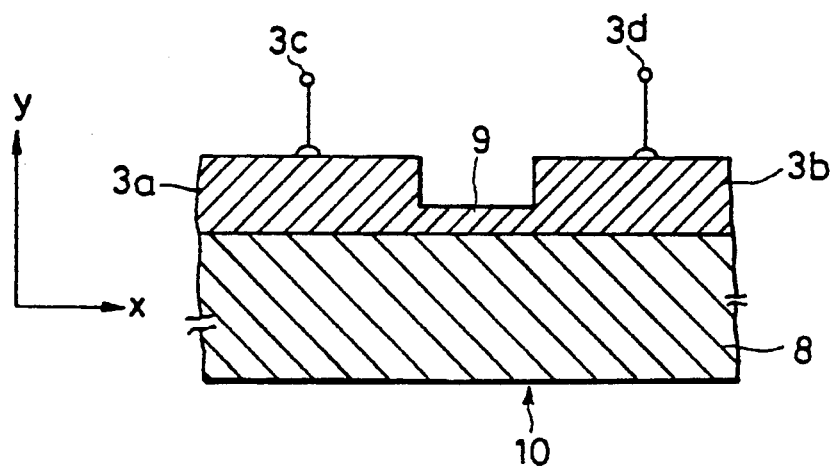
FIG. 11 is a sectional view showing the tenth embodiment of the present invention.

Now, the tenth embodiment of the present invention will be described with reference to FIG. 11. On a photoconductive semiconductor 8 made of CdS, a superconductor having a composition of $(La_{0.9}Sr_{0.1})_2CuO_4$ and being 1 μm thick is deposited by sputtering so that the c-axis of the crystal thereof may become parallel to the substrate 8. Subsequently, the superconductor is heated in an oxygen atmosphere of 950° C. for 2 hours. Thereafter, a part of the superconductor is removed by Ar-ion etching so as to form a superconducting weak-link portion 9 which is 0.2 μm thick and 0.1 μm wide. Then, the superconducting device of the present invention is fabricated. In this device, the direction in which the maximum superconducting current across superconducting electrodes 3a and 3b flows agrees with the direction of the flow of current from the superconducting electrode 3a to the photoconductive semiconductor 8 and the flow of current from the photoconductive semiconductor 8 to the superconducting electrode 3b. Therefore, when light 10 is projected on the photoconductive semiconductor 8, a great current can be caused to flow. Accordingly, the device operates as a photodetective device of high sensitivity and high speed in which the value of the current can be readily controlled with a slight amount of current.

Embodiment 11

Figure 12:
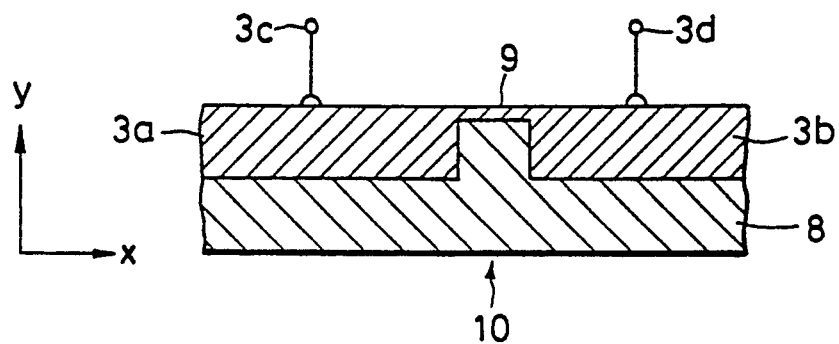
FIG. 12 is a sectional view showing the eleventh embodiment.

Next, the eleventh embodiment of the present invention will be described with reference to FIG. 12. Using a mask of photoresist, a photoconductive semiconductor 8 made of CdS is processed by Ar-ion etching so as to form a projection which is 1 μm high and 0.1 μm wide. After the mask is removed, a superconductor having a composition of $(La_{0.9}Sr_{0.1})_2CuO_4$ and being 2 μm thick is deposited so that the c-axis of the crystal thereof may become perpendicular to the surface of the semiconductor 8. This superconductor is subjected to plasma etching with $CF_4$ gas so that the surface of the superconductor may become uniform and that the thickness thereof on the projection may become 0.2 μm. Subsequently, the superconductor is heated in an oxygen atmosphere at 950° C. for 2 hours. Then, the superconducting device of the present invention is fabricated.

In this device, the direction in which the maximum superconducting current across superconducting electrodes 3a and 3b flows agrees with the direction of the flows of currents along the superconducting electrode 3a—photoconductive semiconductor 8—superconducting electrode 3b. Therefore, when light 10 is projected on the photoconductive semiconductor 8, a great current can be caused to flow. Accordingly, the value of the current to flow can be readily controlled with the light, and the device operates as a photodetective device of high sensitivity and high speed.

Embodiment 12

Figure 13:
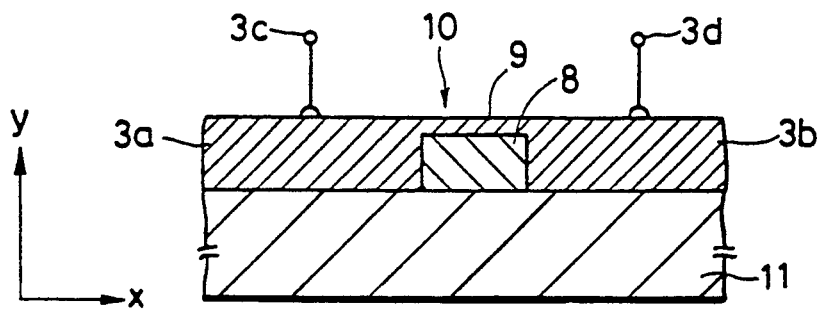
FIG. 13 is a sectional view showing the twelfth embodiment.

Next, the twelfth embodiment of the present invention will be described with reference to FIG. 13. On a substrate 11 made of $SrTiO_3$ and having a surface perpendicular to the c-axis thereof, a photoconductive semiconductor 8 made of CdS and having a thickness of 1 μm is deposited. It is processed into a width of 0.1 μm by Ar-gas ion etching. Subsequently, a superconductor having a composition of $(La_{0.9}Sr_{0.1})_2CuO_4$ and being 2 μm thick is deposited so that the c-axis of the crystal thereof may become perpendicular to the surface of the substrate 11. This superconductor is subjected to plasma etching with $CF_4$ gas so that the surface of the superconductor may become uniform and that the thickness thereof on the photoconductive semiconductor 8 may become 0.2 μm. Subsequently, the superconductor is heated in an oxygen atmosphere at 950° C. for 2 hours. Then, the superconducting device of the present invention is fabricated.

In this device, the direction in which the maximum superconducting current across superconducting electrodes 3a and 3b flows agrees with the direction of the flows of currents along the superconducting electrode 3a—photoconductive semiconductor 8—superconducting electrode 3b. Therefore, when light 10 is projected on the photoconductive semiconductor 8, a great current can be caused to flow. Accordingly, the value of the current to flow can be readily controlled with the light, and the device operates as a photodetective device of high sensitivity and high speed.

Embodiment 13

There will now be described an embodiment in which a superconducting oxide material having the modified structure of the perovskite type crystalline structure, including Ba-Y-Cu oxides, is used as the material of electrodes and the material of a weak-link portion. In the electrode portions, the superconducting oxide material is so oriented that the c-axis of the crystal thereof is perpendicular to the surface of the film thereof. The weak-link portion is perpendicular to the direction of the flow of current, and is in the shape of a band having a width within 10 μm. In this weak-link portion, the superconducting oxide material has such a structure that the c-axis of the crystal thereof is in the direction of the film surface. As an alternative structure, the superconducing oxide material in the weak-link portion is made of a polycrystal, the crystal orientations of which are in all directions.

This structure is formed by a method explained below. The single crystal of $SrTiO_3$, for example, is employed as the material of a substrate. The (100) plane of the $SrTiO_3$ crystal is set parallel to the surface of the substrate. The Ba-Y-Cu oxide, for example, is grown on the substrate surface, whereby the c-axis of the crystal is controlled so as to be in a direction perpendicular to the substrate surface. As regards the weak-link portion, a polycrystalline thin film having ununiform crystal orientations is formed in a part corresponding to the weak-link portion. A Ba-Y-Cu oxide film which is formed on the polycrystalline thin film, becomes a film structure which is polycrystalline and all the crystal orientations (oriented polycrystalline film) of which are not in the c-axial direction.

In order to increase a current capacity in the electrode portions, the superconducting oxide film structure of the electrode portions is set at a structure which is made of one crystal in the direction of the flow of current and in which the crystal is divided by a crystal grain boundary or twin boundary at a spacing of or below 5 μm vertically to the current flow direction within the film surface corresponding to the weak-link portion. In order to obtain such a structure, the parts of the substrate crystal corresponding to the electrode portions of the superconducting oxide film are previously formed with linear defects by dry etching or the like method.

The superconducting weak-link device operates peculiarly as follows: In a process for fabricating the superconducting weak-link device, the step of forming a pattern for the superconducting oxide film itself is not included at all. Accordingly, the deterioration of the superconducting characteristics of the superconducting oxide film at the stage of the fabrication of the device is out of the question.

Figure 14:
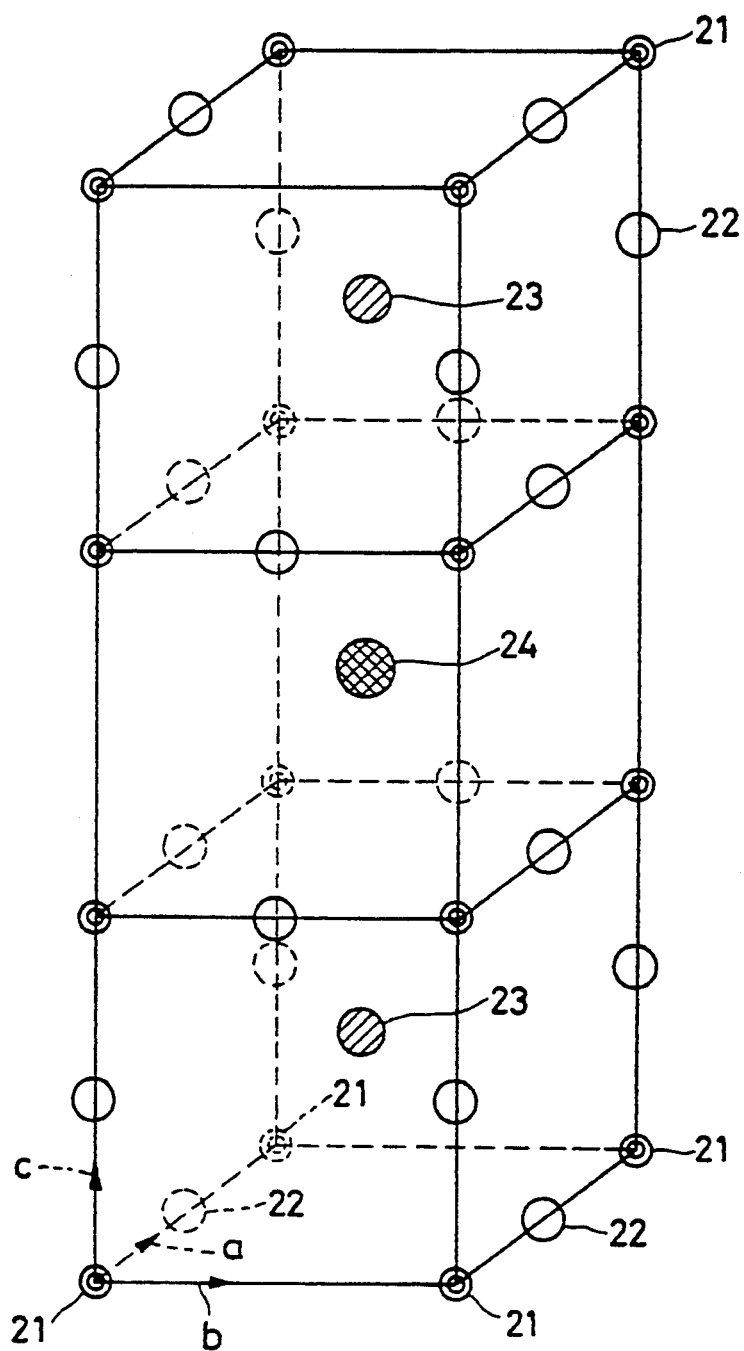
FIG. 14 is a diagram showing the atomic arrangement of a Ba-Y-Cu oxide.

Next, the principle of the superconducting weak-link device will be described. The Ba-Y-Cu oxide superconductor will be taken as an example. As shown in FIG. 14, the crystalline structure of the Ba-Y-Cu oxide is the modified structure of the perovskite crystalline structure and contains the periodic vacancies of oxygen atoms. Referring to the figure, in planes formed by the a-axis and the b-axis with a Ba atom 23 held therebetween, the 3d electrons of Cu atoms 21 and the 2p electrons of oxygen atoms 22 bond to construct bonding pairs. Superconducting electron pairs flow along the bonding pairs of the Cu atoms 21 and the oxygen atoms 22. The bonding pairs of the Cu atoms 21 and the oxygen atoms 22 do not continuously join in the direction of the c-axis, but they are severed in the a-b planes holding a Y atom 24 therebetween. Accordingly, the superconducting electrons are easy of flowing in a direction within the a-b plane and are difficult of flowing in the c-axial direction. As a result, superconducting characteristics such as a critical current density are more excellent in the direction within the a-b plane than in the c-axial direction. By way of example, a critical magnetic field in the case of applying a magnetic field vertically to the c-axis is 3 times as great as a critical magnetic field in the case of applying a magnetic field in parallel with the c-axis. Likewise, the critical current density in the direction within the a-b plane is 3 times or more greater than the critical current density in the c-axial direction. Accordingly, electrode portions are made of a single crystal or a polycrystal the c-axis of the crystal of which is perpendicular to the surface of a substrate, and a weak-link portion is made of a polycrystal the c-axis of the crystal of which does not become perpendicular to the substrate surface. With such a structure, the critical current of the weak-link portion becomes lower than that of the electrode film portions. Accordingly, when current is caused to flow through the device, the shift of a superconducting electron wave phase arises in the weak-link portion, and characteristics as a Josephson device are exhibited.

The controls of the crystal orientations as stated above can be performed by selecting subbing materials. By way of example, $SrTiO_3$ has the perovskite type crystalline structure of cubic system and has a lattice constant of 0.3905 nm. On the other hand, the Ba-Y-Cu oxide has an orthorhombic structure, the lattice constants of which are a=0.3894 nm, b=0.3820 nm and c=1.1688 nm. Thus, the lattice constant of $SrTiO_3$ is nearly equal to the a-axial and b-axial lattice constants of the Ba-Y-Cu oxide. Both $SrTiO_3$ and the Ba-Y-Cu oxide have the crystalline structures belonging to the perovskite type, and have nearly equal atomic spacings. Therefore, the crystal orientation of the Ba-Y-Cu oxide film can be controlled by forming the Ba-Y-Cu oxide on the subbing material of $SrTiO_3$. In order to prevent the Ba-Y-Cu oxide crystal from being so oriented that the c-axis becomes perpendicular to the subbing material, a polycrystalline insulator film or amorphous insulator film the crystal orientations of which are not fixed is employed as the subbing material.

An effect to be stated below is produced by the fact that the superconducting oxide film structure of the electrode portions is set at the structure which is made of one crystal in the direction of the flow of current and in which the crystal is divided by a grain boundary or twin boundary at a spacing of or below 5 μm vertically to the current flow direction within the surface of the film corresponding to the weak-link portion. The coherence length of the Ba-Y-Cu oxide for the superconducting electrons is 1 nm. Accordingly, it incurs the lowering of the current capacity that the grain boundary attended with the variation of a composition exists in the direction of the flow of the current. Meanwhile, when it is intended to attain a current capacity of at least $10^4 A/cm^2$, vortices develop with a conduction current. Unless the vortices generated in the electrodes are pinned, a voltage is generated by a vortex flow, and the superconducting state is broken. The grain boundary or twin boundary is formed vertically to the direction of the current conduction, and is assigned the role of a pinning center for fixing the vortices in the electrode regions.

Figure 15:
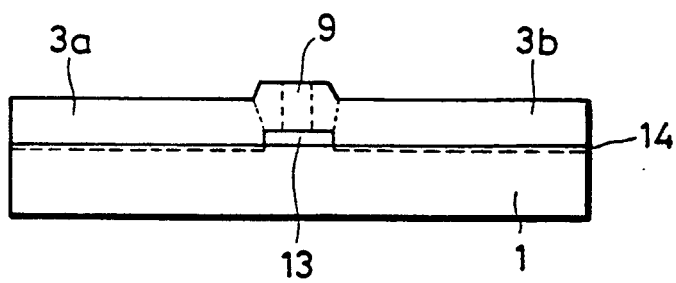
FIG. 15 is a sectional view showing the thirteenth embodiment.

Referring now to FIG. 15, the thirteenth embodiment of the present invention will be described. The fundamental structure of a device having weak link with oxide superconductors consists of a substrate material 1, superconducting electrodes 3a and 3b and a weak-link portion 9. Single-crystal $SrTiO_3$ is employed as the substrate material. The material of the superconducting electrodes is a Ba-Y-Cu oxide, the composition ratio of which among B, Y and Cu is set at 2:1:3. On the other hand, the composition ratio value of oxygen is between 6 and 7. The single crystal of $SrTiO_3$ as the substrate material is in the state in which the surface of the substrate is oriented in the (100) plane. Amorphous $Al_2O_3$ 13 is formed on a substrate part which corresponds to the weak-link portion of the oxide superconducting weak-link device.

A process for manufacturing the oxide superconducting weak-link device is as follows: A resist pattern having a width of 0.8 μm and intervals of 1 μm is formed on an $SrTiO_3$ single-crystal substrate 1. The exposed part of the $SrTiO_3$ substrate 1 is etched by ion-beam etching with Ar. The depth of an etched recess 14 is about 10 nm. Subsequently, an alumina film 13 having a thickness of 30 nm is formed by electron-beam evaporation. In order to prevent the defects or omission of oxygen atoms, the formation of the alumina film 13 is carried out in an atmosphere of oxygen gas. A resist pattern is previously formed on the part other than a weak-link portion so as to prevent the formation of the alumina film. The temperature of the substrate during the evaporation is the room temperature. Single-crystal alumina (sapphire) is used as an evaporation source. The structure of the alumina film formed under such conditions was amorphous according to the result of an X-ray diffraction measurement.

On the substrate 1 processed as described above, a Ba-Y-Cu oxide film is formed. The Ba-Y-Cu oxide film is formed by rf-magnetron sputtering with a Ba-Y-Cu oxide target. The substrate temperature during the formation of the film is set at or below 400° C. The thickness of the film is 1 μm. After the formation thereof, the Ba-Y-Cu oxide film is heat-treated within a range of 800° C.–1000° C. in an oxygen atmosphere, thereby to be crystallized. The result of an X-ray diffraction measurement has revealed that the crystalline structure of the Ba-Y-Cu oxide formed on an $SrTiO_3$ substrate 5 under the same conditions is the modified structure of the perovskite type crystal as shown in FIG. 14 and exhibits the orientation in which the c-axis thereof is perpendicular to the surface of the oxide film. In addition, the crystalline structure of the Ba-Y-Cu oxide formed on an alumina substrate under the same conditions had the modified structure of the perovskite crystal as shown in FIG. 14, but the crystal did not exhibit any special orientation. According to the result of an observation with a scanning electron microscope, the Ba-Y-Cu oxide in the electrode portions 3a and 3b had a linear crystal shape in correspondence with the etching pattern of the substrate, and almost no grain boundaries existed in the linear parts.

The characteristics of the device having weak ling with the Ba-Y-Cu oxide superconductors as fabricated in the above way were measured. Then, the critical current of the device changed at periods of several oersted. This indicates that the device having the weak link with the Ba-Y-Cu oxide superconductors has the Josephson effect. Further, it has been verified that the critical current of the device amounts to 100 $\mu A$ even at the liquid nitrogen temperature, and that the Josephson effect is exhibited in the magnetic field dependence of the critical current, etc.

The critical current density of the electrode film portions at the liquid nitrogen temperature was at least $10^7$ A/cm$^2$, and exceeded 100 times that of the weak-link portion. In contrast, when a Ba-Y-Cu oxide film was formed using as a subbing material an $SrTiO_3$ single-crystal substrate which was not subjected to the etching process, the critical current density thereof at the liquid nitrogen temperature was at most $10^6$ A/cm$^2$.

As thus far described, according to the present embodiment, the following effects are attained as to superconducting devices:

(1) The superconducting critical temperature of a Ba-Y-Cu oxide is 90 K. or higher, and the operation of a superconducting device at the liquid nitrogen temperature has become possible.

(2) Since there is no processing step after the formation of a Ba-Y-Cu oxide film, the superconducting characteristics of the Ba-Y-Cu oxide film do not deteriorate.

(3) Owing to an electrode film structure which pins vortices, the critical current density of the electrode film heightens as compared with that of a Ba-Y-Cu oxide film in the prior art.

Figure 16:
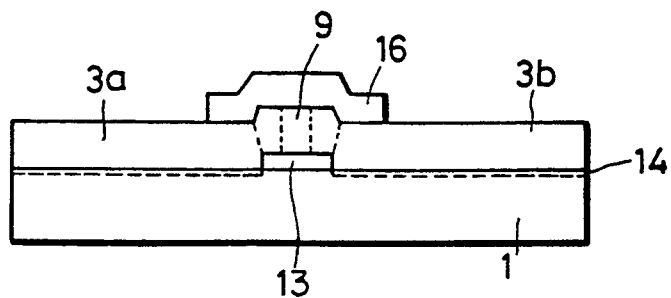
FIG. 16 is a sectional view showing an embodiment in which the superconducting device in FIG. 15 is employed as a photodetector device.

As shown in FIG. 16, a photoconductive semiconductor 16 made of CdS and having a thickness of about 3 $\mu m$ was formed on a superconducting device having the same construction as in FIG. 15. When light was projected on the photoconductive semiconductor, a superconducting weak-link photodetective device the superconducting current of which was decreased by the incident light could be realized.

$(La_{0.9}Ca_{0.1})_2CuO_4$ was employed as the semiconductor material of the foregoing embodiments. This utilizes the feature that, in a material whose composition is denoted by $(La_{1-x}A_x)_2CuO_4$ where A indicates $Sr_{1-y-z}Ba_yCa_z$, by changing the value x, y or z, the superconducting critical temperature of the material can be changed in the state in which the crystallographic properties of the material are held constant. That is, the superconducting material is turned into a semiconductor or a normal-conductor by changing the composition thereof. Even in cases where, as the semiconductor or normal-conductor, the ceramics material was replaced with any of metals such as Cu, Au, Ni and Sn or any of semiconductors such as Si, Ge, GaAs, InSb, InP and InAs, similar effects could be attained.

Besides, although $SrTiO_3$ was employed as the substrate material, any of MgO, sapphire and a garnet material such as GGG may well be employed. Although CdS was employed as the photoconductive material, it may well be replaced with any of Si, InP, InAs, InSb and GaAs.

In the foregoing embodiments, $(La_{0.9}Sr_{0.1})_2CuO_4$ was employed as the superconducting material. Needless to say, however, even when it is replaced with a superconducting oxide material having a composition of $YBa_2Cu_3O_{7-\delta}$, the objects of the present invention can be satisfactorily accomplished. In this material, Y may well be substituted by any of La, Yb, Lu, Tm, Dy, Sc, Ce, Pr, Nd, Sm, Eu, Gd, Tb, Ho, Er, etc., and similar effects can be attained. Such examples are listed in Table 1:

TABLE 1

| Semiconductor (Normal-conductor) | | Superconductor | |
|---|---|---|---|
| $EuBa_2Cu_3O_{7-y}$ | y > 0.5 | $EuBa_2Cu_3O_{7-y}$ | 0 < y < 0.5 |
| $EuSr_2Cu_3O_{7-y}$ | y > 0.5 | $EuSr_2Cu_3O_{7-y}$ | 0 < y < 0.5 |
| $HoBa_2Cu_3O_{7-y}$ | y > 0.5 | $HoBa_2Cu_3O_{7-y}$ | 0 < y < 0.5 |
| $HoSr_2Cu_3O_{7-y}$ | y > 0.5 | $HoSr_2Cu_3O_{7-y}$ | 0 < y < 0.5 |
| $GdBa_2Cu_3O_{7-y}$ | y > 0.5 | $GdBa_2Cu_3O_{7-y}$ | 0 < y < 0.5 |
| $GdSr_2Cu_3O_{7-y}$ | y > 0.5 | $GdSr_2Cu_3O_{7-y}$ | 0 < y < 0.5 |
| $YbBa_2Cu_3O_{7-y}$ | y > 0.5 | $YbBa_2Cu_3O_{7-y}$ | 0 < y < 0.5 |
| $YbSr_2Cu_3O_{7-y}$ | y > 0.5 | $YbSr_2Cu_3O_{7-y}$ | 0 < y < 0.5 |
| $TbBa_2Cu_3O_{7-y}$ | y > 0.5 | $TbBa_2Cu_3O_{7-y}$ | 0 < y < 0.5 |
| $TbSr_2Cu_3O_{7-y}$ | y > 0.5 | $TbSr_2Cu_3O_{7-y}$ | 0 < y < 0.5 |
| $NdCa_2Cu_3O_{7-y}$ | y > 0.5 | $NdCa_2Cu_3O_{7-y}$ | 0 < y < 0.5 |
| $NdSr_2Cu_3O_{7-y}$ | y > 0.5 | $NdSr_2Cu_3O_{7-y}$ | 0 < y < 0.5 |
| $SmBa_2Cu_3O_{7-y}$ | y > 0.5 | $SmBa_2Cu_3O_{7-y}$ | 0 < y < 0.5 |
| $SmSr_2Cu_3O_{7-y}$ | y > 0.5 | $SmSr_2Cu_3O_{7-y}$ | 0 < y < 0.5 |
| $Ba_{2x}La_{2(1-x)}CuO_{4(1-y)}$ | x > 0.05 | $Ba_{2x}La_{2(1-x)}CuO_{4(1-y)}$ | x = 0.05 |
| $Sr_{2x}La_{2(1-x)}CuO_{4(1-y)}$ | x > 0.05 | $Sr_{2x}La_{2(1-x)}CuO_{4(1-y)}$ | x = 0.05 |
| $Ca_{2x}La_{2(1-x)}CuO_{4(1-y)}$ | x > 0.05 | $Ca_{2x}La_{2(1-x)}CuO_{4(1-y)}$ | x = 0.05 |
| $Ba_{2x}Y_{2(1-x)}CuO_{4(1-y)}$ | x > 0.05 | $Ba_{2x}Y_{2(1-x)}CuO_{4(1-y)}$ | x = 0.05 |
| $Sr_{2x}Y_{2(1-x)}CuO_{4(1-y)}$ | x > 0.05 | $Sr_{2x}Y_{2(1-x)}CuO_{4(1-y)}$ | x = 0.05 |
| $Ba_{2x}Eu_{2(1-x)}CuO_{4(1-y)}$ | x > 0.05 | $Ba_{2x}Eu_{2(1-x)}CuO_{4(1-y)}$ | x = 0.05 |
| $Sr_{2x}Eu_{2(1-x)}CuO_{4(1-y)}$ | x > 0.05 | $Sr_{2x}Eu_{2(1-x)}CuO_{4(1-y)}$ | x = 0.05 |
| $Ba_{2x}Eu_{2(1-x)}CuO_{4(1-y)}$ | x > 0.05 | $Ba_{2x}Eu_{2(1-x)}CuO_{4(1-y)}$ | x = 0.05 |

We have shown various above-mentioned embodiments. The present invention is summaried as follows:

(1) A superconducting device comprising:

a substrate;

at least one superconductor which is formed on said substrate, and which property depends upon the crystallographic orientation in such a manner that a superconductivity of the superconducting material constituting said superconductor within a plane is intense, a direction in which current flows through said superconductor being agreement with a direction in which said superconductivity is high.

(2) A superconducting device comprising:

a substrate;

at least one superconductor which is formed on said substrate, and which property depends upon the crystallographic orientation in such a manner that a superconductivity of the superconducting material constituting said superconductor within a plane perpendicular to the c-axis of a crystal of said superconductor is intense, a direction in which current flows through said superconductor being agreement with a direction in which said superconductivity is high, wherein said superconductor includes at a part thereof a weak-link portion in which said c-axis of a crystal thereof is not substantially perpendicular to said direction of said current flowing through said superconductor.

(3) A superconducting device comprising:

either of a semiconductor body and a normal-conductor body;

and at least two superconductors which are formed in contact with said either of said semiconductor body and said normal-conductor body, which property depends upon the crystallographic orientation in such a manner that a superconductivity of the superconducting material constituting said superconductors within a plane perpendicular to the c-axis of a crystal of said superconductors is intense, which are spaced from each other so as to form superconducting weak-link through said either of said semiconductor body and said normal-conductor body, said c-axis being substantially perpendicular to a direction of current flowing through said superconductors, said plane of said crystal of said superconductors is substantioally perpendicular to a contact plane between said either of said semiconductor body and said normal -conductor body and said superconductors in said superconducting weak -link.

What is claimed is:

1. A superconducting apparatus comprising:
a superconductor, formed of a high $T_c$ superconducting oxide having a crystalline structure substantially all of the crystals of which have a c-axis oriented in the same direction; and means for making a superconducting current flow through the superconductor so that the c-axis of the crystals is substantially perpendicular to a direction of the current flowing therethrough.

2. A superconductor formed of a high $T_c$ superconducting oxide having a crystalline structure substantially all of the crystals of which have a c-axis oriented in the same direction; comprising:

an input part of the superconductor to which a current is inputted;

an output part of the superconductor form which the current is outputted; and a central part of the superconductor disposed between the input part and output part, current from the input part flowing through the central part, wherein the c-axis of the crystals of the central part of the superconductor is substantially perpendicular to a direction of current flowing through the central part.

3. A superconductor according to claim 2, wherein the superconductor is a superconducting wiring lead.

* * * * *